United States Patent

Mizumoto et al.

[19]

[11] Patent Number: 5,883,335
[45] Date of Patent: *Mar. 16, 1999

[54] ELECTRICAL CONNECTION SUBSTRATE HAVING A THROUGH HOLE FOR CONNECTING A CHIP TO AN OPPOSITE SURFACE OF THE SUBSTRATE

[75] Inventors: Shogo Mizumoto, Ohtsu; Yutaka Tsukada, Shiga-ken, both of Japan

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 616,118

[22] Filed: Mar. 14, 1996

[30] Foreign Application Priority Data

Mar. 23, 1995 [JP] Japan ..................... 7-064458

[51] Int. Cl.$^6$ ............... H01R 9/09; H05K 7/02; H01L 23/48
[52] U.S. Cl. ................. 174/266; 361/760; 257/774
[58] Field of Search ................. 174/262, 263, 174/264, 265, 266, 250, 255, 260, 261; 29/852; 361/779, 760, 774, 777; 257/700, 774; 228/180.22, 180.21; 438/672, 675

[56] References Cited

U.S. PATENT DOCUMENTS

| | | | |
|---|---|---|---|
| 4,327,247 | 4/1982 | Mituhashi et al. | 174/68.5 |
| 4,694,120 | 9/1987 | Accou | 174/261 |
| 4,736,521 | 4/1988 | Dohya | 29/830 |
| 4,816,323 | 3/1989 | Inoue | 428/200 |
| 5,136,471 | 8/1992 | Inasaka | 361/794 |
| 5,286,926 | 2/1994 | Kimura et al. | 174/250 |
| 5,418,689 | 5/1995 | Alpaugh et al. | 361/792 |
| 5,421,083 | 6/1995 | Suppelsa et al. | 29/852 |
| 5,473,120 | 12/1995 | Ito et al. | 174/264 |
| 5,557,844 | 9/1996 | Bhatt et al. | 174/266 X |
| 5,621,193 | 4/1997 | Isaak | 174/262 |

*Primary Examiner*—Kristine Kincaid
*Assistant Examiner*—William Silverio
*Attorney, Agent, or Firm*—Ira D. Blecker

[57] ABSTRACT

An electrical connection structure for electrically connecting a chip on a mounting surface of a printed circuit board to a back surface of the printed circuit board includes a printed circuit board having a mounting surface and a back surface, the mounting and back surfaces being opposite surfaces of the printed circuit board, a through hole through the printed circuit board and extending from the mounting to the back surface, an electrical conductive layer between the mounting and back surfaces and a layer that permits wiring over the through hole that is electrically isolated from the electrical conductive layer.

16 Claims, 4 Drawing Sheets

ELECTRICAL CONNECTION SUBSTRATE HAVING A THROUGH HOLE FOR CONNECTING A CHIP TO AN OPPOSITE SURFACE OF THE SUBSTRATE

FIELD OF THE INVENTION

The present invention relates to a structure for electrically connecting a semiconductor chip at a surface of a board opposite to that on which the chip is mounted.

BACKGROUND OF THE INVENTION

There is a higher integration requirement in the field of semiconductor packages. A semiconductor chip is usually mounted on a substrate (such as a ceramic package) and is electrically connected to the substrate through the wires within the substrate. The substrate having the semiconductor chip mounted thereon is mounted on a larger substrate called a multilayer printed-circuit board and is electrically connected to the printed-circuit board through the wires within the printed-circuit board. With this structure, the space between electrodes of the semiconductor chip is expanded from 0.1 millimeters (mm)—0.25 mm to 0.3 mm—0.5 mm.

In order to obtain a function such as a semiconductor package has when a semiconductor chip is packaged with a multilayer single-sided or two-sided printed circuit board, the signal lines, power supply lines, and ground lines are pulled from the foot print (electrode) of the chip toward the outer circumference of the printed circuit board. These lines are wiring-connected using through holes (a hole completely passing through the printed circuit board) bored in the printed circuit board to a predetermined position adjacent a mother board. These through holes are usually arranged in the outer circumference of the multilayer printed circuit board. This is because, if the through holes are arranged near the chip, i.e., in the central position of the multilayer printed circuit board, they will hinder the lines being pulling out of the chip.

The wirings formed in the multilayer printed circuit board are connected by holes (via-holes) formed in a plurality of wirings layers provided on a substrate that is part of the printed circuit board. A method of building up wiring layers including such via-holes one layer by one layer is called a building-up method. A multilayer structure formed by the building-up method is referred to as a surface laminar circuit (SLC) structure/layer. A section of the SLC structure is shown in FIG. 1. This structure is formed, for example, by coating a photosensitive insulation layer 2 on a substrate 1 of a printed circuit board 6, forming a via-hole 3 in the insulation layer 2, and forming on the via-hole 3 a wiring layer 4 having a predetermined pattern by photoetching. This via-hole 3 is a small hole for electrically connecting the wiring layers built up one layer by one layer. A number of layers thus formed are built up to form a SLC layer. This wiring layer 4, together with the via-hole 3, electrically connects a large number of connection terminals (not shown) extending from a semiconductor chip to be mounted on the substrate 1, and exhibits a predetermined function. In the SLC structure, the electrical connection between layers is established by the via-hole 3 instead of a through hole 5. As a result, the degree of freedom of the wiring is increased.

The printed circuit board is mounted on the mother board. The printed circuit board and the mother board are interconnected by the wiring provided on the boards and exhibit a predetermined function. In order to connect a connection terminal of the chip and a solder bump (a connection terminal to the printed circuit board), a conductive channel passing through the substrate of the printed circuit board is needed. This is because the connection terminal of the chip and the solder bump are provided on the different, opposite surfaces of the printed circuit board. The through hole is provided for connection purposes.

FIG. 2 shows the relationship between a semiconductor chip 10, a printed circuit board 100, through holes 5, solder bumps 15, and a mother board 200. The semiconductor chip 10 is connected through connection terminals 11 to the mounting surface 32 of the printed circuit board 100. One skilled in the art would recognize that the connection terminals can be part of a package (not shown) to which the chip has been previously mounted. The printed circuit 100 is connected through the solder bumps 15 to the mother board 200. The SLC layer of FIG. 1 corresponds to the surface layer portion 13 of the printed circuit board 100 (FIG. 4). The through hole 5 is usually provided at the inner side thereof with a conductive metal layer 25 serving as a conductive channel. It is preferable that this metal layer 25 be plated with copper, but it may be plated with solder. A wire 12 extending from the chip connection terminal 11 of the semiconductor chip 10 is connected through the SLC layer 13 to the metal layer 25 and through a SLC layer 14 formed in a back surface 34 of the substrate 1 to the solder bumps 15 connected to the mother board 200.

The diameter of the through hole 5 is 0.2 mm at the lowest from the point of the drilling cost and yield. In addition, an electrode called a land 7 needs to be arranged on the opposite ends of the through hole 5, so the total diameter becomes about 0.3 mm. The relative area of the through hole 5 to the printed circuit board 100 is by no means small, and since the through hole 5 passes through the substrate 1 of the printed circuit board 100, it considerably hinders the degree of freedom of the wiring within the printed circuit board 100, including the SLC structure 13 and 14. The wiring is high in density particularly around the semiconductor chip 10, so it is not practical to provide the through holes 5 in the vicinity of the semiconductor chip 10 which hinders the degree of freedom of the wiring. Thus, the through hole 5 is indispensable for connecting the wiring layer of the chip mounting surface 32 and the wiring of the back surface 34, but, on the other hand, it hinders increasing the density of the wiring. Therefore, the through holes 5 have so far been arranged in the opposite outer end portions 36 of the printed circuit board 100, as shown in FIG. 2.

However, in this structure, the wiring leading from the chip connection terminal 11 to the solder bump 15 becomes longer and causes noise and delay. Forming the through hole 5 in the vicinity of the chip 10 is the easiest way for solving the problems, but since the density of the wiring is very high in the vicinity of the chip 10, it is not possible to form the through hole 5 in the vicinity of the chip 10, which considerably affects the wiring density. Therefore, in view of the wiring density, the position where a through hole 5 is formed will become a position away from the chip 10 by some distance. Thus, the through hole 5 and the chip 10 need to be spaced by a certain distance l, so a high integration is hindered. In other words, the wiring length from the chip connection terminal 11 to the solder bump 15 has to be not less than at least 2l.

Substrates where through holes are filled up with insulation resin and conductive paste have been developed in recent years. For example, PUPA 4-287906 discloses a substrate in which through holes are filled up with conductive material so that the elements mounted on the substrate surface and the back surface can be connected electrically. However, this invention is for mounting thin-film elements, and adopts such a substrate where elements can be mounted on the back surface, in order to avoid the disadvantage (magnetic influence, etc.) as thin-film elements are mounted on the same surface. The invention disclosed in the above publication does not have the object of the present invention that the wiring length between the chip and solder ball is shortened and the degree of freedom of the wiring is improved, thereby achieving high integration.

Japan Laid-Open Patent Publication No. HEI 6-164149 discloses a method of fabricating a multilayer printed substrate having through holes filled up with conductive paste. Japan Laid-Open Patent Publication No. HEI 2-142198 discloses a method in which unit wiring plates formed with through holes are stacked so that the through holes are vertically aligned with each other, and after they are bonded together, a conductive layer is formed in a through opening constituted by a plurality of through holes. However, in these publications there is no description for the connection between a chip to be mounted and a board, and the methods disclosed therein cannot achieve the object of the present invention.

PUPA 6-45506 filed by the assignee of the present application discloses a method of electrically connecting the both surfaces of a substrate, without using through holes, by only a via-hole. However, the present invention has a different object because the present invention relates to improve the conventional combination of through holes and SLC structure. PUPA 6-45506 connects both surfaces by forming the via holes only with building up without using the substrate. It is impossible, however, to assure the strength for the entire structure only with the via holes and without using the substrate. Since a semiconductor package is distributed as a product, it is necessary to have a certain degree of strength in view of its handling. A substrate provides necessary strength. Then, when packaging is performed by using a substrate with high strength such as a glass-epoxy substrate or a metal substrate, electrical connection between both surfaces cannot be attained by the via hole, and through holes must be used. The via hole is formed by a process such as etching. However, it is very difficult to form a through hole by completely etching the substrate. Therefore, PAPU 6-45506 is based on a presumption totally different from the present invention.

Another drawback of using the through hole lies in that the wiring of the SLC layer is prevented by the presence of the through hole because the through hole completely passes through the substrate. For example, as shown at a position 20 in FIG. 2, if a through hole exists, the wiring in the SLC layer is completely broken. The through hole 5 cannot be positioned near the chip 10 because wiring from the connection terminals 11 is very complicated so that there is no space for a through hole 5 which would prevent the wiring and consume area near the chip 10.

It is the easiest approach that the through hole is used to form a conductive channel from one surface to the other. Therefore, the through hole cannot be completely eliminated. Accordingly, it is desired to have a structure which does not prevent the degree of freedom in providing wiring in the SLC layer while maintaining the function assuring a conductive channel from one surface to the other.

SUMMARY OF THE INVENTION

It is a problem to be solved by the present invention to make it possible to freely perform wiring within a surface laminar circuit (SLC) layer while maintaining the conductive channel ensuring function of a through hole. With this, it is an object of the present invention to make shorter the wiring length from a chip to a solder bump and remove an adverse influence such as noise.

According to the present invention, a plurality of through holes are formed in a substrate of a printed circuit board. A conductive channel is formed in each through hole and each through hole is filled with material such as an insulation resin or conductive paste. An SLC layer is formed on at least one surface of the substrate, and the connection terminal of a chip and the solder bump on the back surface of the printed circuit board are electrically connected through the SLC layer and the conductive channel within the through hole.

More specifically, the structure according to the present invention is an electrical connection structure for electrically connecting a semiconductor chip positioned on a first surface of a printed circuit board to the other surface of the printed circuit board. The electrical connection structure comprises a substrate of the printed circuit board having a through hole therein that is filled up, an SLC layer provided on at least a first surface of a substrate, a conductive channel formed in the through hole and in contact with the SLC layer, first connection means for electrically connecting a semiconductor chip connection terminal and the conductive channel formed in the through hole through the SLC layer, and second connection means for electrically connecting a solder bump to be put into contact with the printed circuit board and the conductive channel, the solder bump being provided on the surface opposite to the first surface.

Since the SLC layer can be formed on the filled up through holes, the wiring of the SLC layer is not hindered by the through hole. Therefore, since the distance between the through hole and the chip can be shortened, the integration can be increased and the wiring length can be considerably reduced.

DETAILED DESCRIPTION OF THE PREFERRED EMBODIMENTS

Figure 1:
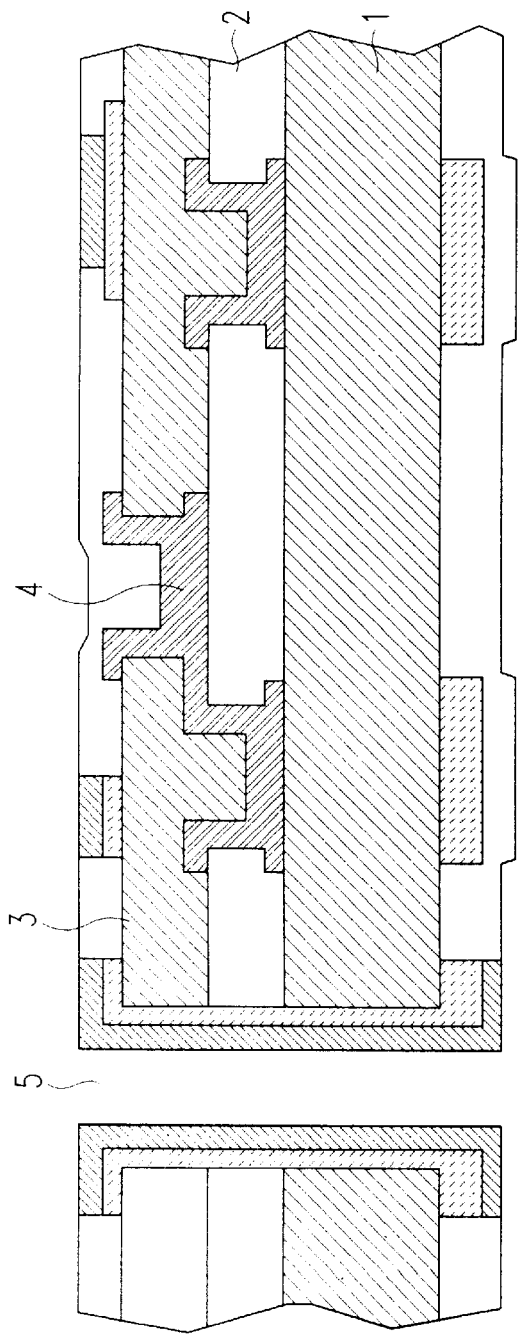
FIG. 1 is a sectional view showing a conventional surface laminar circuit (SLC) substrate.
Figure 2:
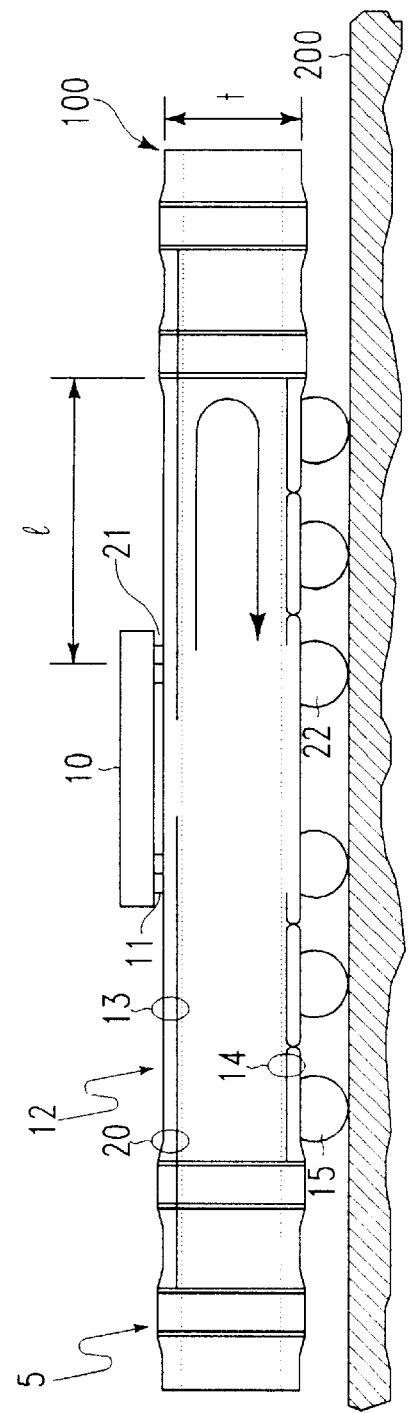
FIG. 2 is a sectional view showing the connection between a chip and a printed circuit board according to prior art and the arrangement of through holes.
Figure 3:
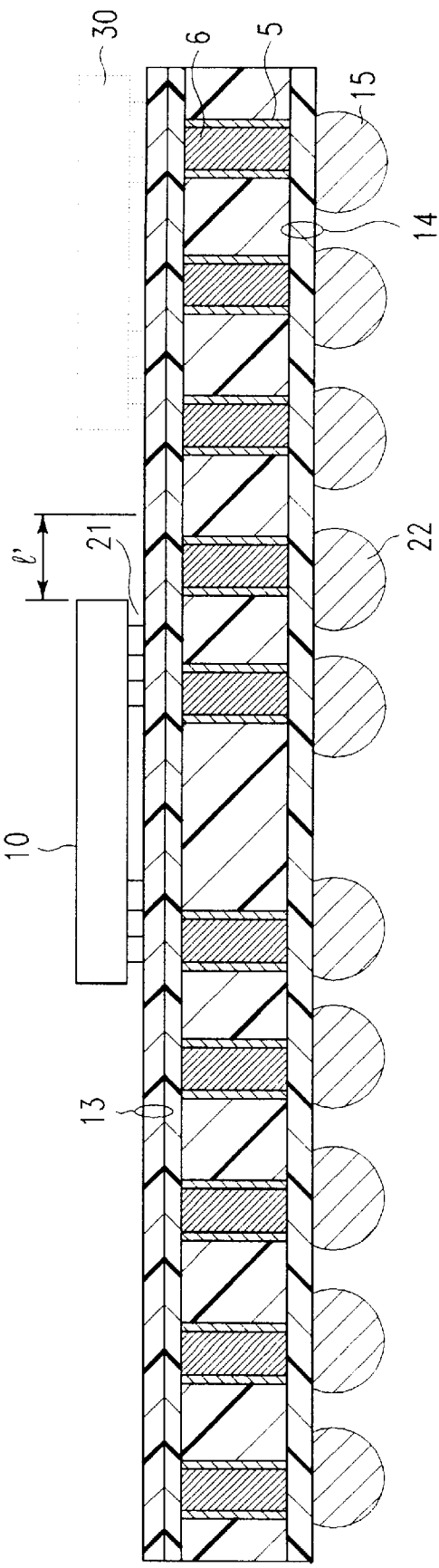
FIG. 3 is a sectional view showing the connection between a chip and a printed circuit board according to the present invention and the arrangement of through holes.

FIG. 3 shows an embodiment of a structure according to the present invention. Preferably, the structure is a printed circuit board. As with the structure of FIG. 2, a chip 10 and a printed circuit board 300 are connected by flip chip bonding, and the connection terminal 11 of the chip 10 on a mounting surface 332 of the printed circuit board 300 is electrically connected to a solder ball 15 formed on a back surface 334 of the printed circuit board 300. The printed circuit board 300 is used for illustrative purposes. One skilled in the art will recognize that the invention can be used in structures other than printed circuit boards. The structure of the present invention is unique in that (1) a through hole 50 does not pass through surface laminar circuit (SLC) layers 13 and 14 and (2) since the through hole 50 is filled, the wiring of a SLC layer is possible over the through hole 50.

Figure 4:
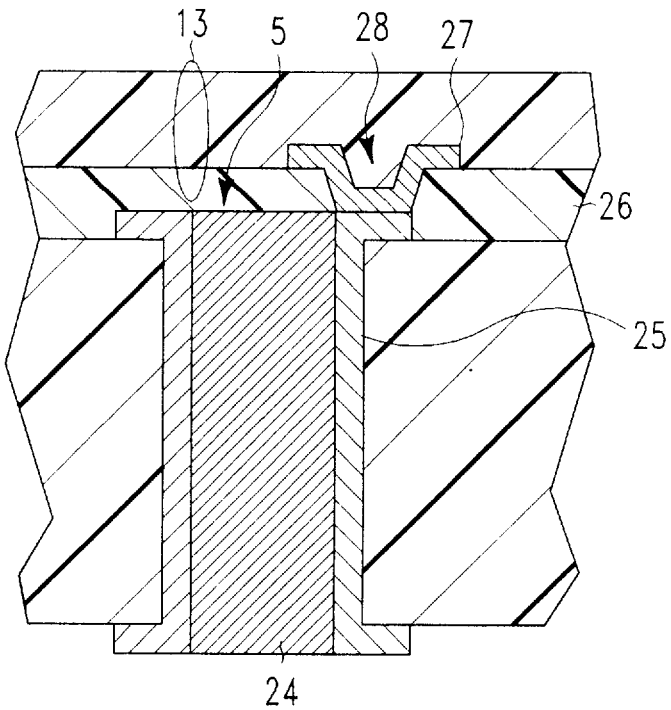
FIG. 4 is an enlarged sectional view showing the relationship between the filled through hole and the SLC layer according to the present invention.

FIG. 4 is an enlarged view showing the through hole 50 and SLC layer of FIG. 3. The through hole 50 is filled up with a filling material 24, and the interior surface of the through hole 50 is covered with a conductive layer 25. The material 24 is either an insulative or conductive material. When a conductive material (for example, conductive paste) is used, the conductive layer 25 can be omitted. When an insulative material (for example, insulation resin) is used, the conductive layer 25 can be omitted. It is preferable that the conductive layer 25 be plated with copper. The conductive layer 25, or conductive material 24, is connected to a plated layer 27 on a via-hole 28 formed in an insulation layer 26 of the SLC layer 13. The conductive layer 25 is electrically connected through the plated layer 27 to the connection terminal 11 (FIG. 3). The SLC layer 13 may be a single layer or a plurality of layers. Also, a via-hole (not shown) can be provided right above the filled up through hole 50.

Because the through hole 50 is filled up, the wire length between the connection terminals 11, 21 of the chip 10 and the solder bump 15 can be shortened. For example, when in FIG. 2 the specific connection terminal 21 and the solder bump 15A are connected, the wiring length is about 2l+t if the distance to the through hole is expressed in terms of l and the thickness of the printed circuit board is expressed in terms of t, as shown by the arrow. On the other hand, in the present invention as illustrated in FIG. 3, the wiring length between the connection terminal 21 and the solder bump 15B is only about 2l'+t, wherein l' is less than l. The shortening of the wiring length is very significant from the standpoint of a reduction in noise or delay.

Also, the above-described structure can shorten the mounting distance between chips. For example, if a design of wiring is allowed, another chip 30 can be mounted in the vicinity of the chip 10. This contributes to high integration.

Further, the wiring of the SLC layer is not hindered by the existence of the through hole 50 because the SLC layer can be formed over the filled through hole 50. Therefore, the wiring within the SLC layer can freely be performed, and the degree of freedom of a design can be increased. As a result, a plurality of chips can be mounted on one printed circuit board, and the mounting density can be increased.

While in the embodiment of the present invention the chip and the printed circuit board have been connected by flip chip bonding, they may be connected by wire bonding.

Figure 5:
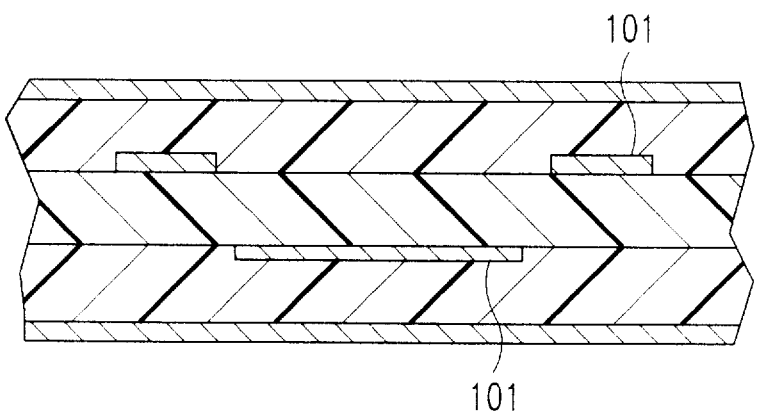
FIGS. 5–9 are sectional views showing the steps of a fabrication method of a connection structure according to the present invention.
Figure 6:
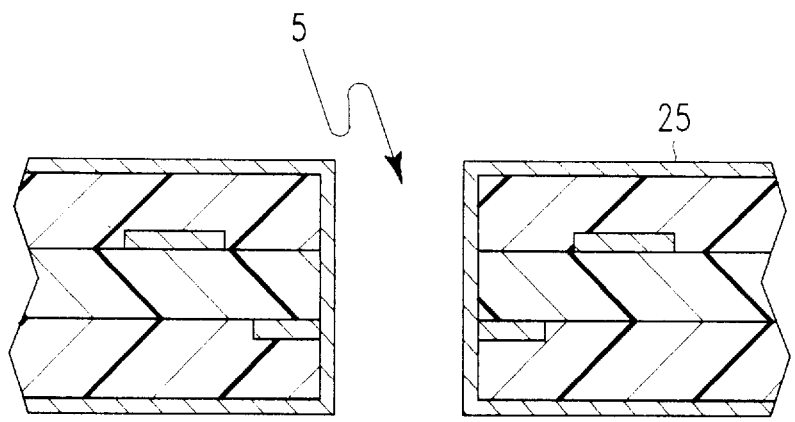
Figure 7:
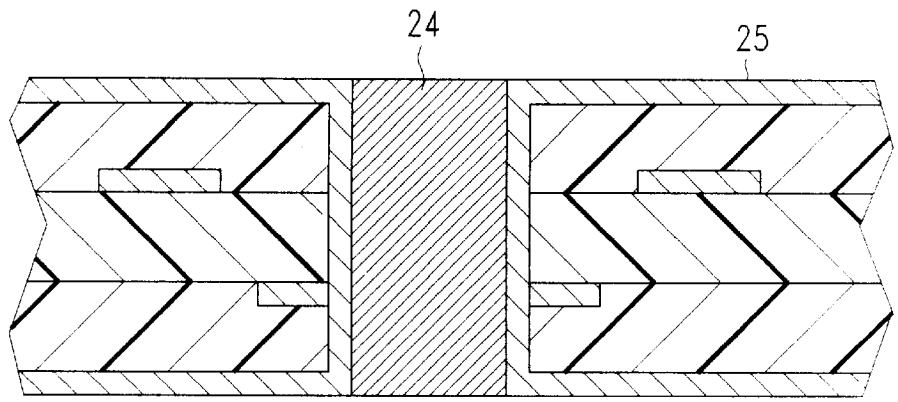
Figure 8:
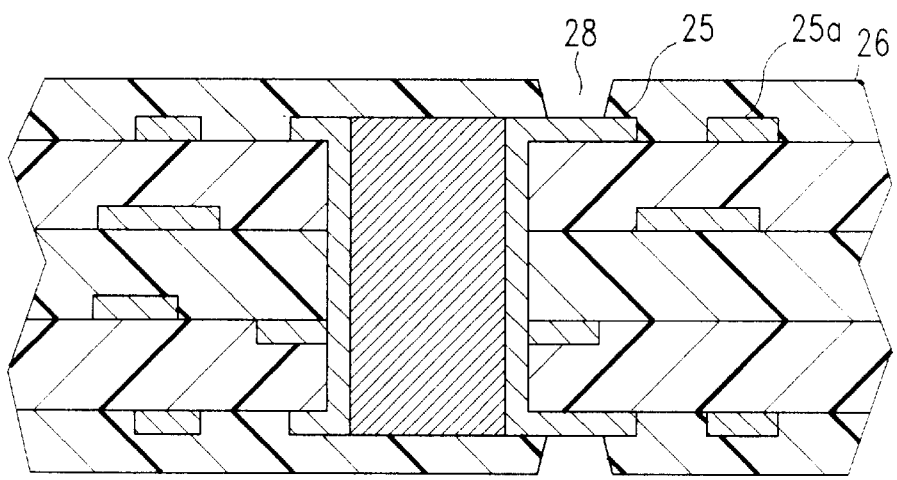

Next, a method of fabricating a structure according to the present invention will be described. In FIG. 5, a SLC layer is formed on a substrate 290 of a printed circuit board 300. Also, power supply, signal, and ground lines 301 have been built in the substrate 290. Next, as shown in FIG. 6, a through hole 50 is formed in the substrate 290, and a conductive layer 25 is formed on the mounting surface 332 and on the inner surface of the through hole 50. The through hole 50 is formed by drilling. The conductive layer 25 is preferably plated with copper by electro plating or electroless plating. Next, as shown in FIG. 7, the though hole 50 is filled up with material 24. The through hole 50 is preferably filled up by screen printing, and the surface thereof is then smoothed by a belt sander or buff grinding. Next, as shown in FIG. 8, the conductive layer 25 on the mounting surface 332 is patterned to a predetermined pattern 25*a*. Thereafter, an insulating layer 26 is coated such as by screen printing or curtain coating. A via-hole 28 is in the insulating layer 26.

Figure 9:
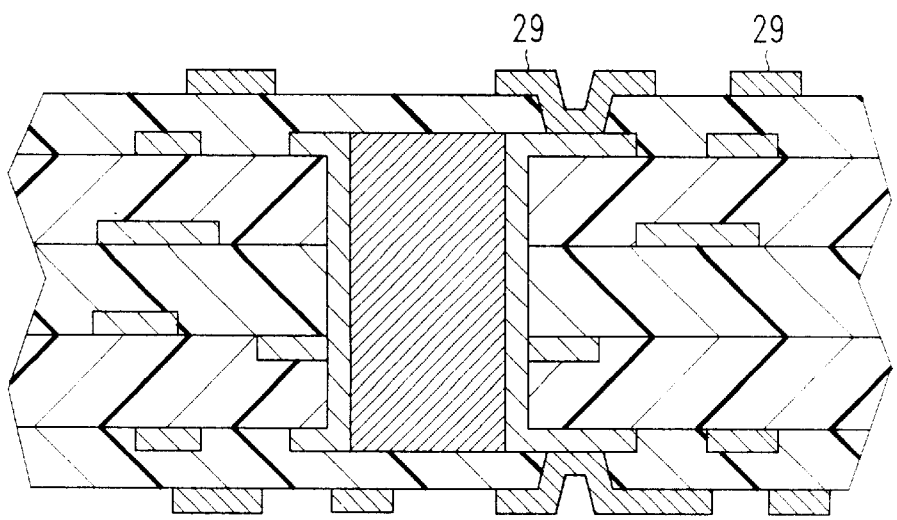

As shown in FIG. 9, a second conductive layer 29 is formed on the via-hole 28 or at a predetermined position. The processes described in FIGS. 8 and 9 are the processes of a known building-up method, although the method has not been used in a structure disclosed herein. Thus, by forming conductive layers one by one by a building-up method, formation of a SLC layer is possible independently of the through hole 50.

As a modification of the present invention, a conductive paste can be used as a filling material 24 for the through hole 50. If the filling material 24 is conductive, the plated layer 25 within the through hole 50 can be omitted.

According to the present invention, a conductive layer is formed on a through hole (or a conductive material fills the through hole), a SLC layer is provided on a substrate, and the connection terminal of a semiconductor chip is connected through this SLC layer to a solder ball. Therefore, the present invention has the following advantages.

(1) A structure which can shorten the distance of the wiring length between the connection terminal of a semiconductor chip and a solder bump to achieve noise reduction.

(2) The mounting distance between chips can be shortened, thereby contributing to high integration.

(3) Since the wiring of the SLC layer is not hindered by the existence of the through hole, the high integration and the degree of freedom of a design can be ensured.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. An electrical connection structure for electrically connecting a chip on a mounting surface of a substrate to a back surface of the substrate, comprising:

a substrate having a mounting surface and a back surface, the mounting surface and back surface being opposite surfaces of the substrate;

a through hole having a wall defining an opening through the substrate from the mounting to the back surface;

means for conducting electricity between the mounting and back surfaces which includes metal on the wall of the through hole;

insulating material in a central portion of the through hole and in contact with the conducting means; and a layer that permits wiring over the through hole that is electrically insulated from the conducting means, said layer comprising wiring in the layer, the conducting means further including wiring in the layer in electrical contact with the metal on the wall of the through hole.

2. The structure of claim 1 wherein the layer is adjacent the mounting surface.

3. The structure of claim 1 further comprising, in the layer, means for electrically connecting the conducting means to a chip.

4. The structure of claim 3 wherein the conducting means is a via.

5. The structure of claim 1 wherein the substrate is capable of receiving a chip over the through hole.

6. The structure of claim 1 wherein the layer is a first layer and further comprising a second layer that permits wiring over the through hole that is electrically isolated from the conducting means, the conducting means further including wiring in the layer in electrical contact with the metal on the wall of the through hole, one of the first and second layers being adjacent the mounting surface and the other being adjacent to the back surface.

7. A method of fabricating an electrical connection structure comprising the steps:

provide a substrate having a mounting surface and a back surface, the mounting and back surfaces being opposite surfaces of the substrate;

defining a through hole having a wall through the substrate from the mounting surface to the back surface;

forming means for conducting electricity between the mounting and back surfaces comprising plating a metal on the wall of the through hole;

plating a single layer of metal directly on the mounting surface and back surface of the substrate;

filling a central portion of the through hole with insulating material, the insulating material in contact with the conducting means;

patterning the single layer of metal that is directly on the mounting surface and back surface of the substrate; and forming a layer directly on the patterned single layer of metal that permits wiring over the through hole that is electrically isolated from the conducting means, the layer formed directly on the patterned single layer of metal comprising wiring therein, the conducting means further including wiring in the layer in electrical contact with the metal on the wall of the through hole.

8. A printed circuit board having an electrical connection for electrically connecting a chip on a mounting surface of the printed circuit board to a back surface of the printed circuit board, comprising:

a printed circuit board having a mounting surface and a back surface, the mounting and back surfaces being opposite surfaces of the printed circuit board;

a through hole having a wall defining an opening through the printed circuit board from the mounting surface to the back surface;

means for conducting electricity between the mounting and back surfaces which includes metal on the wall of the through hole;

insulating material in a central portion of the through hole and in contact with the conducting means; and a layer that permits wiring over the through hole that is electrically insulated from the conducting means, the layer comprising wiring in the layer, the conducting means further including wiring in the layer in electrical contact with the metal on the wall of the through hole.

9. The printed circuit board of claim 8 wherein the layer is adjacent the mounting surface.

10. The printed circuit board of claim 8 further comprising, in the layer, means for electrically connecting the conducting means to a chip.

11. The printed circuit board of claim 10 wherein the conducting means is a via.

12. The printed circuit board of claim 8 wherein the printed circuit board is capable of receiving a chip over the through hole.

13. The printed circuit board of claim 8 wherein the layer is a first layer and further comprising a second layer that permits wiring over the through hole that is electrically isolated from the conducting means, the conducting means further including wiring in the layer in electrical contact with the metal on the wall of the through hole, one of the first and second layers being adjacent the mounting surface and the other being adjacent to the back surface.

14. A method of fabricating a printed circuit board comprising the steps:

providing a printed circuit board having a mounting surface and a back surface, the mounting and back surfaces being opposite surfaces of the printed circuit board and being free of a metallic layer, the printed circuit board having a substrate;

defining a through hole having a wall through the substrate from the mounting surface to the back surface;

forming means for conducting electricity between the mounting and back surfaces comprising plating a metal on the wall of the through hole;

plating a single layer of metal directly on the mounting surface and back surface of the substrate;

filling a central portion of the through hole with insulating material, the insulating material in contact with the conducting means;

patterning the single layer of metal that is directly on the mounting surface and back surface of the substrate; and forming a layer directly on the patterned single layer of metal that permits wiring over the through hole that is electrically isolated from the conducting means, the layer formed directly on the patterned single layer of metal comprising wiring therein, the conducting means further including wiring in the layer in electrical contact with the metal on the wall of the through hole.

15. A method of fabricating an electrical connection structure comprising the steps:

providing a substrate having a mounting surface and a back surface, the mounting and back surfaces being opposite surfaces of the substrate;

defining a through hole having a wall and a central portion through the substrate from the mounting surface to the back surface;

forming means for conducting electricity between the mounting and back surfaces which includes plating a metal on the wall of the through hole;

filling the entire central portion of the through hole with insulating material, so that said through hole consists of said plated wall and said central portion of insulating material;

forming a layer that permits wiring over the through hole that is electrically isolated from the conducting means, the conducting means further including wiring in the layer in electrical contact with the metal on the wall of the through hole.

16. A method of fabricating a printed circuit board comprising the steps:

providing a printed circuit board having a mounting surface and a back surface, the mounting and back surfaces being opposite surfaces of the printed circuit board, the printed circuit board having a substrate;

defining a through hole having a wall and a central portion through the substrate from the mounting surface to the back surface;

forming means for conducting electricity between the mounting and back surfaces which includes plating a metal on the wall of the through hole;

filling the entire central portion of the through hole with insulating material, so that said through hole consists of said plated wall and said central portion of insulating material;

forming a layer that permits wiring over the through hole that is electrically isolated from the conducting means, the conducting means further including wiring in the layer in electrical contact with the metal on the wall of the through hole.

* * * * *